(12) United States Patent
Brandl et al.

(10) Patent No.: US 9,847,316 B2
(45) Date of Patent: Dec. 19, 2017

(54) PRODUCTION OF OPTOELECTRONIC COMPONENTS

(71) Applicant: OSRAM Opto Semiconductors GmbH, Regensburg (DE)

(72) Inventors: Martin Brandl, Kelheim (DE); Tobias Gebuhr, Regensburg (DE)

(73) Assignee: OSRAM Opto Semiconductors GmbH

( * ) Notice: Subject to any disclaimer, the term of this patent is extended or adjusted under 35 U.S.C. 154(b) by 0 days.

(21) Appl. No.: 15/119,806

(22) PCT Filed: Feb. 18, 2015

(86) PCT No.: PCT/EP2015/053388
§ 371 (c)(1),
(2) Date: Aug. 18, 2016

(87) PCT Pub. No.: WO2015/124608
PCT Pub. Date: Aug. 27, 2015

(65) Prior Publication Data
US 2017/0062382 A1 Mar. 2, 2017

(30) Foreign Application Priority Data
Feb. 20, 2014 (DE) .................. 10 2014 102 183

(51) Int. Cl.
*H01L 21/00* (2006.01)
*H01L 23/00* (2006.01)
*H01L 33/48* (2010.01)
*H01L 33/62* (2010.01)
*H01L 33/00* (2010.01)

(52) U.S. Cl.
CPC .......... *H01L 24/97* (2013.01); *H01L 33/0095* (2013.01); *H01L 33/486* (2013.01); *H01L 33/62* (2013.01); *H01L 2224/48091* (2013.01); *H01L 2924/181* (2013.01); *H01L 2933/0033* (2013.01); *H01L 2933/0066* (2013.01)

(58) Field of Classification Search
CPC ....... H01L 2924/00014; H01L 2924/00; H01L 2924/181; H01L 2924/13091; H01L 21/568
See application file for complete search history.

(56) References Cited

U.S. PATENT DOCUMENTS 6,544,812 B1 * 4/2003 Camenforte ............ H01L 23/36 257/E23.069
9,601,413 B2 * 3/2017 Fan .................... H01L 23/49551
(Continued)

FOREIGN PATENT DOCUMENTS

DE 10 2005 041 064 A1 3/2007
JP 2003-209286 A 7/2003
JP 2010-232644 A 10/2010

*Primary Examiner* — Zandra Smith
*Assistant Examiner* — John M Parker
(74) *Attorney, Agent, or Firm* — DLA Piper LLP (US)

(57) ABSTRACT

A method of producing optoelectronic components includes providing an auxiliary carrier, forming separate connection elements on the auxiliary carrier, forming a molded body on the auxiliary carrier with recesses, arranging optoelectronic semiconductor chips on connection elements in the recesses of the molded body, removing the auxiliary carrier, and severing the molded body to form singulated optoelectronic components.

13 Claims, 10 Drawing Sheets

(56) References Cited

U.S. PATENT DOCUMENTS

| | | | |
|---|---|---|---|
| 2009/0065800 A1* | 3/2009 | Wirth | H01L 31/022408 257/100 |
| 2011/0024786 A1 | 2/2011 | Suglyama | |
| 2013/0147054 A1* | 6/2013 | Lin | H01L 24/96 257/774 |
| 2014/0054619 A1* | 2/2014 | Tseng | H01L 33/504 257/88 |

* cited by examiner

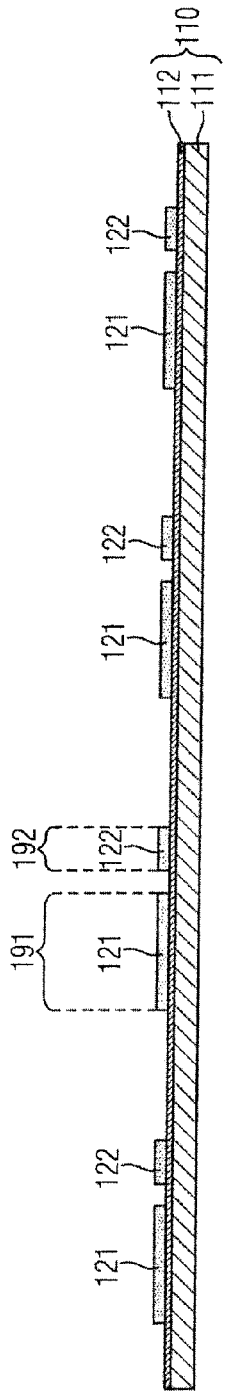
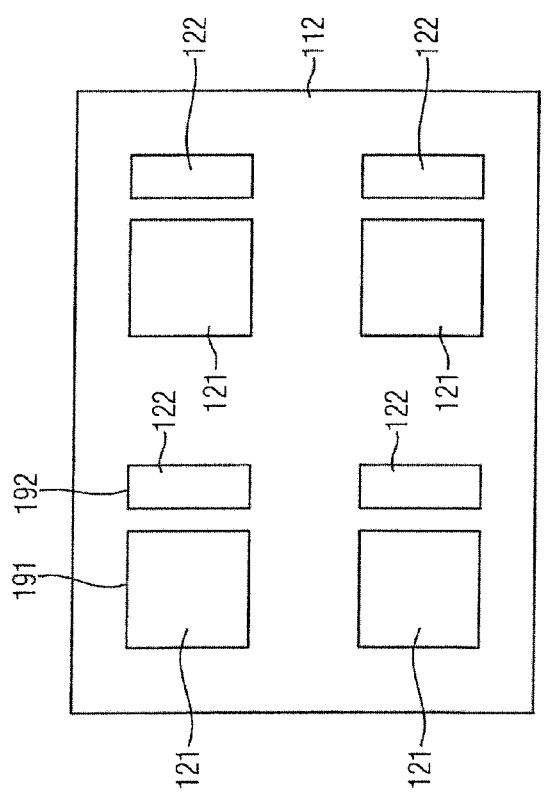

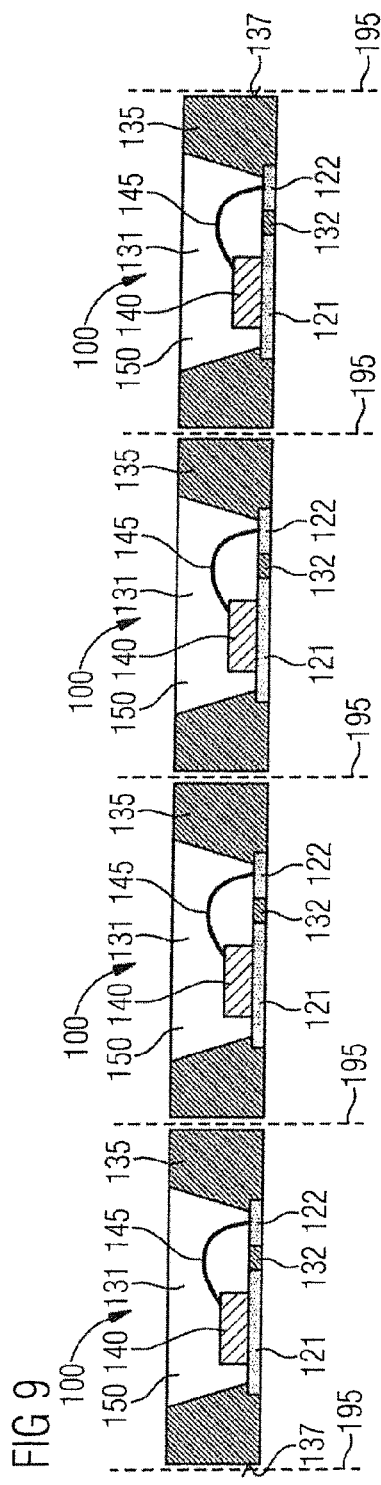
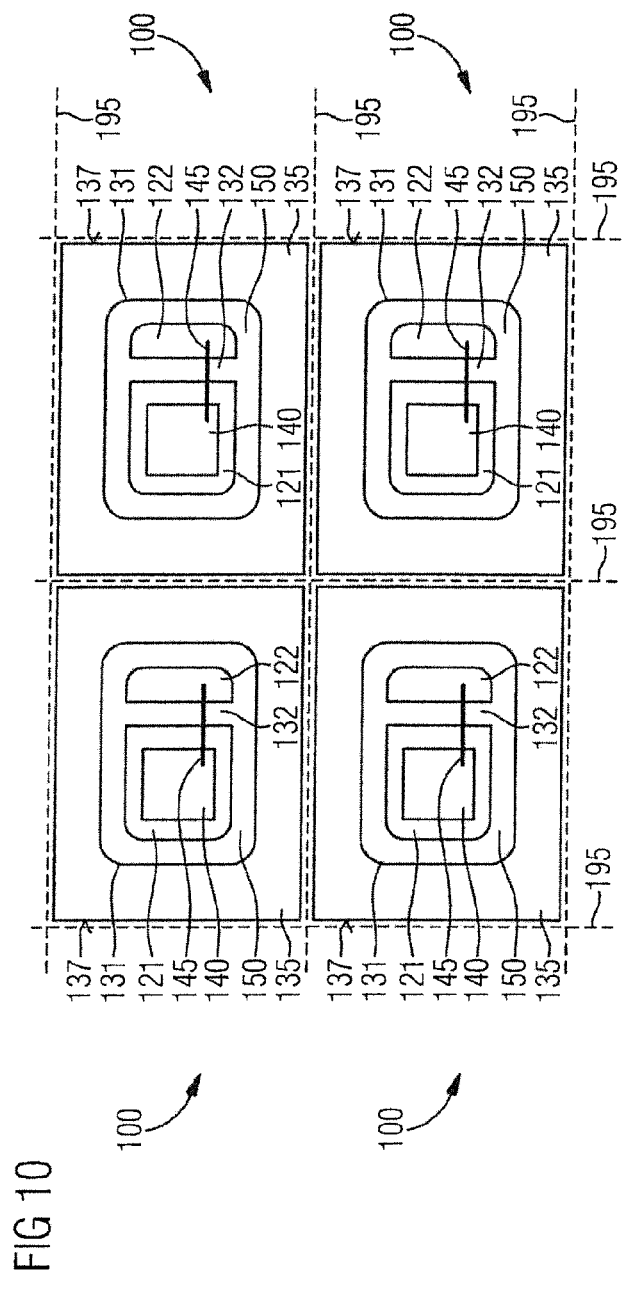

PRODUCTION OF OPTOELECTRONIC COMPONENTS

TECHNICAL FIELD

This disclosure relates to a method of producing optoelectronic components and an optoelectronic component.

BACKGROUND

Optoelectronic components that generate light radiation may be realized in the form of QFN packages (Quad Flat No Leads). There are disadvantages associated with traditional production of such components.

A leadframe comprising connection pads and web-shaped connecting structures is usually provided. For this purpose, a carrier composed of copper is structured. This may be carried out by masking carrier regions with a photoresist and etching. The structured leadframe is furthermore provided with an expensive coating (for example, NiAg or NiPdAu) by electroplating. As a result, the leadframe is suitable for soldering and connecting bond wires. Although required only in bond and soldering regions, usually the entire leadframe is coated, which means a cost disadvantage. Alternatively, regions of the leadframe may be masked to coat the leadframe only locally (spot plating). This is complex and costly.

Furthermore, a molding compound is molded around the leadframe to form a molded body. The molded body comprises recesses via which the connection pads are exposed at a front side. At these locations, light-emitting semiconductor chips are arranged on the connection pads and electrically connected thereto. The rear sides of the connection pads likewise remain free to be able to solder the QFN components produced onto a circuit board. Further processes are filling the recesses with a potting compound, and singulating the component assemblage produced in this way.

In a process-governed manner, the connection pads may comprise residues of the molding compound at the front side. To avoid problems associated therewith when arranging the semiconductor chips, after the molding-around process, a cleaning step of removing the residues is usually carried out (deflashing). In this process, gaps may form between the leadframe and the molded body. Subsequently filling the recesses of the molded body may have the consequence that the potting compound used creeps through the gaps and the rear sides of the connection pads are contaminated as a result (seepage). This may cause soldering problems for the components. Preventive measures such as applying a rear-side film by adhesive bonding or applying a rear-side protective lacquer, or subsequently removing the residues of the potting compound, are complex and expensive.

Singulating involves severing, generally sawing, through an inhomogeneous material combination, i.e., the molded body and the web-shaped connecting structures of the copper leadframe. This limits the possible sawing speed to produce clean outer edges of the components. In that process, the intention is to avoid smearing material of the copper webs since short circuits may otherwise occur. In the singulated components, the copper webs reach the outer sides thereof and may therefore corrode.

SUMMARY

We provide a method of producing optoelectronic components including providing an auxiliary carrier, forming separate connection elements on the auxiliary carrier, forming a molded body on the auxiliary carrier with recesses, arranging optoelectronic semiconductor chips on connection elements in the recesses of the molded body, removing the auxiliary carrier, and severing the molded body to form singulated optoelectronic components.

We also provide an optoelectronic component produced by carrying out the method of producing optoelectronic components including providing an auxiliary carrier, forming separate connection elements on the auxiliary carrier, forming a molded body on the auxiliary carrier with recesses, arranging optoelectronic semiconductor chips on connection elements in the recesses of the molded body, removing the auxiliary carrier, and severing the molded body to form singulated optoelectronic components, wherein the component includes a housing body produced by severing of the molded body, and the component includes a circumferential lateral surface formed exclusively by the housing body.

We further provide a method of producing optoelectronic components including providing an auxiliary carrier, forming separate connection elements on the auxiliary carrier, forming a molded body on the auxiliary carrier with recesses, arranging optoelectronic semiconductor chips on connection elements in the recesses of the molded body, removing the auxiliary carrier, and severing the molded body to form singulated optoelectronic components, wherein the molded body is formed on the auxiliary carrier, the molded body coves a part of the auxiliary carrier such that the auxiliary carrier is exposed in separate opening regions, after forming the molded body the separate connection elements are formed, and forming the separate connection elements includes applying material on the auxiliary carrier in the opening regions.

BRIEF DESCRIPTION OF THE DRAWINGS

FIGS. 1 to 10 show one possible method sequence of producing optoelectronic components on the basis of lateral illustrations and plan view illustrations, which involves forming connection elements before producing a molded body on an auxiliary carrier.

LIST OF REFERENCE SIGNS

Figure 3:
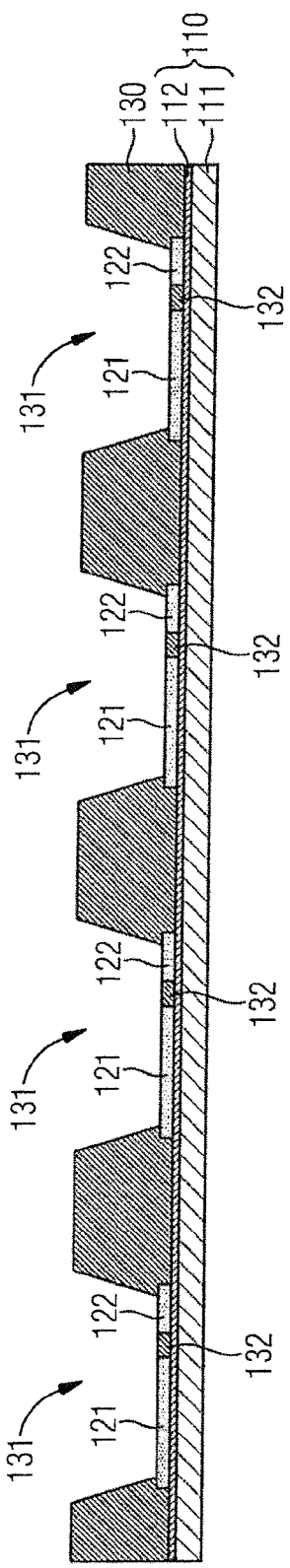

100, 101 Component
110 Auxiliary carrier
111, 112 Layer
115 Auxiliary carrier
121, 122 Connection pad
130 Molded body
131 Recess
132, 133 Web
135 Housing body
137 Lateral surface
140 Semiconductor chip
145 Bond wire
150 Potting compound
191, 192 Region
195 Separating line

DETAILED DESCRIPTION

We provide a method of producing optoelectronic components. The method comprises providing an auxiliary carrier, forming separate connection elements on the auxiliary carrier, and forming a molded body on the auxiliary carrier with recesses. Arranging optoelectronic semiconductor chips on connection elements in the recesses of the molded body, removing the auxiliary carrier, and severing the molded body to form singulated optoelectronic components are further provided.

The method involves forming separate connection elements on the temporarily used auxiliary carrier, the separate connection elements being electrically conductive. In this context, separate means spatially separated such that the connection elements are not connected to one another by material of the connection elements. It is possible to first form the connection elements and subsequently the molded body on the auxiliary carrier. Alternatively, these two steps may be carried out in the opposite order. Afterward, the further steps of the method may be carried out in the following order, i.e., arranging optoelectronic semiconductor chips on connection elements in the recesses of the molded body, subsequently removing the auxiliary carrier, and subsequently separating the molded body to form singulated optoelectronic components.

The optoelectronic components formed by singulating the previously produced component assemblage may be so-called QFN packages (Quad Flat No Leads) suitable for surface mounting (SMT, surface-mounting technology). The connection elements by which the components may be soldered onto a circuit board may be realized in the form of planar layer elements or connection pads (bond pads).

The method affords a number of advantages. Forming separate connection elements instead of using a copper leadframe with connection pads and supporting connecting structures makes it possible merely to sever the molded body to singulate the component assemblage. In this way, this process may be carried out simply and rapidly. A high manufacturing throughput and hence a cost saving are possible as a result.

Severing the molded body may be carried out by sawing, for example. In this case, the sawing may be carried out at a high sawing speed of up to 500 mm/s. In a conventional manufacturing method, the sawing is carried out at a much lower sawing speed, for example, of only approximately 50 mm/s, owing to the inhomogeneous material combination (molded body, connecting structures) present there.

Besides sawing, other processes may also be used for singulating. Laser cutting or water jet cutting is possible, for example.

A further advantage is that the component assemblage, owing to the use of the separate connection elements instead of a leadframe with connection pads and connecting structures, can be realized with a high or higher packing density. This, too, results in a cost saving.

Furthermore, the complex processes carried out when using a conventional leadframe such as structuring a carrier into the leadframe and coating the leadframe, may be obviated.

It is furthermore advantageous that the singulated optoelectronic components may comprise no copper webs reaching the outer side. The components may therefore be corrosion-stable and insensitive with respect to short circuits.

Further possible examples of the production method are described in greater detail below.

The method may be carried out such that the optoelectronic components produced in accordance with the method are single-chip components. In this case, the components may each comprise a housing body produced from the molded body with a recess, a plurality of or two separate connection elements exposed at a rear side, and an optoelectronic semiconductor chip. The semiconductor chip may be arranged in the recess of the housing body on a connection element.

The connection elements may be formed, for example, in the form of an individual layer comprising an electrically conductive or metallic material, for example, Ag or Au. A multilayered construction is also possible such that the connection elements are realized in the form of a layer stack composed of different partial layers arranged one above another. By way of example, consideration is given to an arrangement one above another composed of a first partial layer comprising Ag, a second partial layer comprising Cu and a third partial layer comprising Ag.

Forming the separate connection elements may comprise applying material on the auxiliary carrier in separate, i.e., spatially separated or mutually spaced apart, application regions. In this case, material of the connection elements may be applied on the auxiliary carrier in a targeted manner with a structure and shape provided for the connection elements. Furthermore, forming the connection elements in a material-saving manner is possible, as a result of which a cost saving may be further fostered.

Various processes may be used to form the connection elements or applying material of the connection elements. One possible process is a printing process in which material of the connection elements is printed onto the auxiliary carrier. A suitable printing form may be used in the printing process, as a result of which material of the connection elements may be applied on the auxiliary carrier in a targeted manner with the structure provided for the connection elements in separate printing regions. A thermal process (sintering) to harden the connection elements may be carried out after printing.

A further possible process is electrochemical deposition (electroplating). Before deposition, a structured masking layer, for example, a photoresist layer, may be formed on the auxiliary carrier, the layer partly covering the auxiliary carrier such that the auxiliary carrier is exposed in separate opening regions. A targeted deposition of material of the connection elements on the auxiliary carrier in the opening regions is possible as a result.

A further possible process is electroless chemical deposition (electroless plating). In this case, likewise before the deposition, a structured masking layer, for example, a photoresist layer may be formed on the auxiliary carrier, the layer partly covering the auxiliary carrier such that the auxiliary carrier is exposed in separate opening regions. A targeted deposition of material of the connection elements on the auxiliary carrier in the opening regions is possible as a result.

A further possible process is a sputtering process (cathode sputtering). By way of example, a lift-off method may be employed in this context. In this case, before the sputtering, a structured masking layer, for example, a photoresist layer is formed on the auxiliary carrier, the layer partly covering the auxiliary carrier such that the auxiliary carrier is exposed in separate opening regions. During sputtering, material of the connection elements may be deposited over the whole area, that is to say both directly onto the auxiliary carrier in the opening regions and on the masking layer. Afterward, the masking layer may be removed. In the process of removing the masking layer, a portion of the sputtered material that is situated on the masking layer may be concomitantly removed such that only the separate connection elements remain on the auxiliary carrier.

Forming the separate connection elements may comprise forming a (continuous) initial layer on the auxiliary carrier and structuring the initial layer into the connection elements. In this way, the connection elements may likewise be formed on the auxiliary carrier in a targeted manner with a structure provided for the connection elements. Forming the initial layer may comprise, for example, carrying out a sputtering process. Structuring the initial layer may be carried out, for example, by an etching process using a structured masking layer, for example, a photoresist layer. The masking layer may be formed before the structuring on the initial layer.

A multilayered configuration of the connection elements made from a plurality of partial layers may be realized by carrying out a plurality of the abovementioned material applying processes successively to apply different materials. By way of example, a plurality of printing processes may be carried out successively. Moreover, a plurality of electrolytic or electrochemical deposition processes, or else a plurality of chemical deposition processes, may be carried out successively, in each case using the same masking layer. In the same way, a plurality of sputtering processes may be carried out successively, with use of a masking in each case with the same masking layer. Afterward, the masking layer may be removed. In a corresponding manner, an initial layer constructed from a plurality of partial layers, for example, by carrying out a plurality of successive sputtering processes may subsequently be structured into separate connection elements.

First, the separate connection elements may be formed on the auxiliary carrier, and, after forming the connection elements, the molded body is formed on the auxiliary carrier. The molded body is produced such that the connection elements are (at least partly) exposed via the recesses of the molded body at a front side. In this way, optoelectronic semiconductor chips may subsequently be arranged in the recesses on connection elements. The connection elements may be partly covered by the molded body at the front side at the edge.

First, the molded body may be formed on the auxiliary carrier. The molded body covers a part of the auxiliary carrier such that the auxiliary carrier is exposed in separate opening regions. After forming the molded body, the separate connection elements are formed. For this purpose, material is applied on the auxiliary carrier in the opening regions. In this procedure, the molded body may serve as a masking layer. A use of a different masking layer may therefore be obviated. In this example, the method can thus be carried out flexibly and cost-effectively.

In the abovementioned configuration of the method in which application regions are predefined on the auxiliary carrier by the masking molded body, forming the separate connection elements may comprise carrying out (if appropriate repeatedly) an electrochemical deposition. Carrying out (if appropriate repeatedly) an electroless chemical deposition is also possible.

Forming the molded body may comprise carrying out a molding or mold process. In this process, a suitable molding or mold compound is applied on the auxiliary carrier. By way of example, a matrix material composed of epoxy resin or silicone containing a particle filling, for example, $SiO_2$ particles, is usable. If appropriate, consideration may be given to carrying out, after forming the molded body, an additional process to remove residues of the molding compound on front sides of the connection elements (deflashing).

The mold process may be a transfer molding process. This may furthermore be a film-assisted transfer molding process. In this process, the mold cores of a tool part of a mold tool are sheathed with a film for better sealing. What may be achieved in this way is that, with a high reliability, the connection elements are not covered with undesirable residues of the molding compound on the front side.

The molded body may be formed such that in each case at least two connection elements are exposed on the front side via each recess of the molded body. In a process of forming the molded body before forming the connection elements, the molded body may be formed such that in each case at least two opening regions exposing the auxiliary carrier (in which opening regions the auxiliary carrier is subsequently coated with material of the connection elements) are present in the region of each recess of the molded body. Within each recess, there may be present in each case between two connection elements or opening regions a, for example, web-shaped part of the molded body that may have a smaller thickness than a part of the molded body surrounding the associated recess.

The optoelectronic semiconductor chips, which may be designed to generate light radiation, may be light-emitting diode chips. The semiconductor chips may comprise a frontside contact and a rear-side contact. With regard to such a configuration, two connection elements may be provided for each of the semiconductor chips. A semiconductor chip positioned in a recess of the molded body may electrically and mechanically connect to a connection element by the rear-side contact. A connection may be produced via a suitable connecting layer, for example, a solder layer or a layer of an electrically conductive adhesive. The front-side contact of the relevant semiconductor chip may connect to a further connection element via a suitable connecting structure, for example, a bond wire.

The method may comprise introducing a potting compound into the recesses of the molded body. Introducing the potting compound may be carried out after arranging optoelectronic semiconductor chips on connection elements in the recesses of the molded body and before removing the auxiliary carrier. The potting compound may surround the semiconductor chips (and the bond wires), and form a protective encapsulation in this way. The method may likewise prove to be advantageous with regard to introducing the potting compound. This is because the composite assemblage comprising the molded body and the connection elements may be sealed toward the rear side by the auxiliary carrier. A rear-side contamination of the connection elements with the potting compound may be avoided in this way.

The potting compound may comprise a radiation-transmissive potting material, for example, silicone. Furthermore, it may be provided that the potting compound additionally comprises phosphor particles for radiation conversion embedded in the potting material. In this way, the potting compound may convert at least part of a light radiation generated by the semiconductor chips during operation (volume conversion). Alternatively, the optoelectronic semiconductor chips may comprise conversion layers or laminar conversion elements for radiation conversion on a front side (surface conversion). In this configuration, the potting compound may comprise only a radiation-transmitting potting material.

For the auxiliary carrier, which is removed again at the end of the process, various configurations may be considered. In one example, the auxiliary carrier comprises an electrically conductive material. In this way, the auxiliary carrier is suitable, for example, to form the connection elements by an electrochemical deposition or an electroless chemical deposition.

One possible example is an auxiliary carrier composed of copper. The copper auxiliary carrier may be removed such that at least part of the copper is recycled. A further cost advantage is achievable as a result.

The auxiliary carrier may comprise a first layer and a second layer. The connection elements and the molded body are formed on the second layer. The second layer may be, for example, an electrically conductive layer, for example, composed of ZnO. In this way, the auxiliary carrier is likewise suitable to form the connection elements by an electrochemical deposition or an electroless chemical deposition. The first layer may comprise glass or silicon, for example.

With regard to a different applying process to form the connection elements, other or electrically non-conductive materials may also be used for the auxiliary carrier. In one possible configuration of the auxiliary carrier comprising first and second layers, the auxiliary carrier may comprise a second layer composed of SiN, for example. In this case, the first layer may be formed from glass, for example.

Depending on the configuration of the auxiliary carrier, various processes may be carried out to remove the same. One possible process is an etching process. The latter may be used in an auxiliary carrier composed of copper. In a configuration of the auxiliary carrier comprising first and second layers, (only) the second layer may be etched.

A further possible process is a laser lift-off process carried out by a laser. Such a process can be carried out in an auxiliary carrier comprising a first layer composed of glass and a second layer composed of a different material. The second layer may be decomposed using the laser, the radiation of which may be transmitted through the glass layer.

Further features and details may moreover be applied for the method. By way of example, the method can be carried out such that multi-chip components are produced that comprise a plurality of optoelectronic semiconductor chips. Such components may, for example, each comprise a housing body produced from the molded body with a plurality of separate recesses in which semiconductor chips may be arranged on corresponding connection elements.

Furthermore, multi-chip components can be manufactured that each comprise a housing body produced from the molded body with a common recess for a plurality of semiconductor chips. In this case, a plurality of semiconductor chips may be arranged on individual or else on one or more common connection elements. For this purpose, the method may be carried out such that in each case a plurality of connection elements exposed on the front side or opening regions to be coated are present in the region of each recess of the molded body. Furthermore, it is possible for in each case a plurality of semiconductor chips positioned in a common recess of the molded body to electrically interconnect, for example, by bond wires. A connection of two semiconductor chips may be realized, for example, by a bond wire connected to a front-side contact of a semiconductor chip and to a connection element on which a further semiconductor chip is arranged.

In the method, furthermore, semiconductor chips may be used that comprise, for example, only two rear-side contacts or only two front-side contacts. In the first variant, a semiconductor chip may each be arranged by the two rear-side contacts on two connection elements and connected thereto. In the second variant, a semiconductor chip may each be arranged on a connection element and one of the two front-side contacts may connect to the same connection element via a bond wire. The other front-side contact may connect to a further connection element via a further bond wire. Alternatively, provision may be made of three connection elements for a semiconductor chip, of which two connection elements are used for connection to the front-side contacts and a further connection element is used (only) to fix a semiconductor chip.

We also provide an optoelectronic component produced by carrying out the method specified above or one of the possible examples of the method. The component comprises a housing body produced by the severing from the molded body. Furthermore, the component comprises a circumferential lateral surface formed exclusively by the housing body and hence the molding compound. Consequently, copper webs reaching the lateral surface are not present. Therefore, the component may be corrosion-stable and insensitive to short circuits.

The expression lateral surface used here is synonymous with the lateral edge or edge region of the component. The lateral surface present between a front side and a rear side of the component is composed of all lateral outer sides or side walls of the component. The component produced in accordance with the method may have, for example, in plan view a rectangular contour or overall a parallelepipedal shape such that the lateral surface may be composed of four side walls adjoining one another at right angles.

Aspects and details mentioned above with regard to the production method may also be applied to the optoelectronic component. In this respect, the housing body of the component may comprise at least one recess. The component may comprise at least two separate connection elements exposed at a rear side, and at least one optoelectronic semiconductor chip. The semiconductor chip may be arranged in the or in a recess of the housing body on a connection element. The at least one recess may furthermore be filled with a potting compound. The component may be a single-chip component or a multi-chip component.

The advantages and developments explained above may be applied individually or else in arbitrary combination with one another, apart from, for example, when there are clear dependencies or incompatible alternatives.

The above-described properties, features and advantages and the way in which they are achieved will become clearer and more clearly understood in association with the following description of examples explained in greater detail in association with the schematic drawings.

Possible examples of a method of producing optoelectronic components are described with reference to the following schematic figures. In this case, processes known from semiconductor technology and the fabrication of optoelectronic components may be carried out and materials customary in these fields may be used and, thus, will be discussed only in part. In the same way, the components may be fabricated with further component parts and structures in addition to component parts shown and described. It is furthermore pointed out that the figures are merely of schematic nature and are not true to scale. In this sense, component parts and structures shown in the figures may be illustrated with exaggerated size or size reduction to afford a better understanding.

FIGS. 1 to 10 show one possible method of producing optoelectronic components 100. The components 100 are surface-mountable single-chip components realized in each case in the form of a QFN package. Each component 100 comprises an optoelectronic semiconductor chip 140 that generates radiation.

An assemblage of continuous components is fabricated in the method and subsequently singulated into the components 100. FIGS. 1 to 10 illustrate the method on the basis of lateral illustrations and plan view illustrations. An excerpt from the assemblage or the conditions respectively present is shown in each case. The structures shown in the figures may therefore be present alongside one another in a multiply repeating fashion in a plane.

A temporarily used auxiliary carrier 110 is provided in the method, the auxiliary carrier being shown from the side in FIG. 1. The auxiliary carrier 110 comprises a first layer 111 and a second layer 112. Further component parts are subsequently formed on the second layer 112 or an exposed main side thereof. The layer 112 may be electrically conductive and comprise ZnO, for example. A configuration of the layer 112 composed of an electrically nonconductive material, for example, composed of SiN is also possible. The first layer 111 may comprise silicon or glass, for example.

Furthermore, as is shown from the side in FIG. 1 and in plan view in FIG. 2, separate planar connection elements 121, 122 are formed on the layer 112 of the auxiliary carrier 110. The connection elements 121, 122, which are electrically conductive, are spatially separated from one another, and not connected to one another by material of the connection elements 121, 122. The connection elements 121, 122 may have a rectangular shape and may be formed in the form of a grid of rows and columns on the auxiliary carrier 110 (cf. FIG. 2).

Forming the separate connection elements 121, 122 instead of using a leadframe in which connection elements connect by connecting structures affords the possibility of providing a configuration of the connection elements 121, 122 with small spacings with respect to one another. As a result, the component assemblage may be realized with a high packing density.

Hereinafter, on account of the planar structure, the connection elements 121, 122 are referred to as connection pads 121, 122. In this case, the larger connection pads 121 are also referred to as first connection pads 121, and the smaller connection pads 122 are also referred to as second connection pads. A pair comprising a first and a second connection pad 121, 122 is respectively provided for each of the components 100 to be produced.

The connection pads 121, 122 may be formed in each case in the form of an individual layer comprising an electrically conductive or metallic material. The metallic material may be Ag or Au, for example.

Forming the metallic connection pads 121, 122 may be carried out by applying material of the connection pads 121, 122 on the auxiliary carrier 110 or the layer 112 thereof in separate regions 191, 192. Applying the material may be carried out in various ways.

One possible procedure is to carry out a printing process. In this case, a suitable printing form may be used, by which material of the connection pads 121, 122 can be printed onto the auxiliary carrier 110 in separate regions 191, 192. The material to be printed may be present in the form of a metal paste. The printing form may be a screen printing form or a stencil printing form. A thermal process (sintering) may be carried out after printing to harden the printed connection pads 121, 122.

A further possible process is electrochemical deposition. For electroplating, the layer 112 of the auxiliary carrier 110 is electrically conductive, for example, composed of ZnO as indicated above. As a result, the layer 112 may serve as a deposition electrode to which a corresponding electrical potential is applied for the deposition. Before the deposition process, a structured masking layer, for example, a photoresist layer is formed on the layer 112 (not illustrated). The masking layer comprises a structure such that a part of the layer 112 is covered and the layer 112 is open in separate regions 191, 192. In this way, in the context of the electrochemical deposition, material may be grown selectively in the opening regions 191, 192 on the layer 112 of the auxiliary carrier 110. The masking layer may subsequently be removed again.

One possible process similar thereto is electroless chemical deposition. For this purpose, the layer 112 of the auxiliary carrier 110 is likewise electrically conductive, for example, composed of ZnO as indicated above. In this case, too, before the deposition process, a structured masking layer, for example, a photoresist layer is formed on the layer 112 (not illustrated). The masking layer comprises a structure such that a part of the layer 112 is covered and the layer 112 is open in separate regions 191, 192. In this way, in the context of the chemical deposition, material may be grown selectively in the opening regions 191, 192 on the layer 112 of the auxiliary carrier 110. The masking layer may subsequently be removed again.

A further process taken into consideration is a sputtering process. The sputtering process may be applied in the context of a lift-off method. For this purpose, before sputtering, a structured masking layer, for example, a photoresist layer is formed on the layer 112 of the auxiliary carrier 110 and partly covers the layer 112 such that the layer 112 is open in separate regions 191, 192 (not illustrated). In the course of sputtering, material may be deposited over a large area, that is to say both directly onto the layer 112 of the auxiliary carrier 110 in the regions 191, 192 and onto the masking layer. The masking layer may subsequently be removed. In this case, that portion of the sputtered material situated on the masking layer may simultaneously be stripped away, as a result of which only the separate connection pads 121, 122 remain on the layer 112 of the auxiliary carrier 110.

Moreover, further procedures may be taken into consideration to form the connection pads 121, 122. It is possible, for example, to form an initial layer over the whole area on the layer 112 of the auxiliary carrier 110, for example, by sputtering (not illustrated). The initial layer may subsequently be structured into the connection pads 121, 122 by etching. The etching process may be carried out using a structured masking layer, for example, a photoresist layer formed subsequently on the initial layer.

A multilayered construction may also be taken into consideration for the connection pads 121, 122 such that the connection pads 121, 122 are constructed in the form of a layer stack comprising partial layers composed of different materials (not illustrated). Material applying processes mentioned above may be carried out repeatedly for this purpose. By way of example, a plurality of printing processes may be carried out successively. Moreover, a plurality of electrochemical deposition processes or a plurality of chemical deposition processes, in each case using the same masking layer, may be carried out successively. In the same way, a plurality of sputtering processes, in each case with the same masking layer when a lift-off method is carried out, may be carried out successively. The masking layer may subsequently be removed. It is also possible to form an initial layer from a plurality of partial layers, for example, by a plurality of sputtering processes carried out successively and subsequent to structure it into the connection pads 121, 122. One example of a multilayered construction of the connection pads 121, 122 is an arrangement one above another composed of a first partial layer comprising Ag, a second partial layer comprising Cu and a third partial layer comprising Ag.

Figure 4:
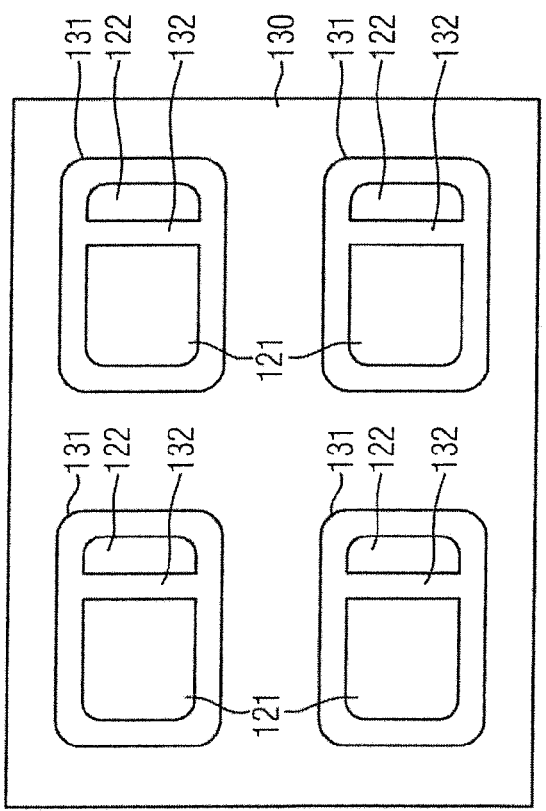

After forming the connection pads 121, 122, as is shown from the side in FIG. 3 and in plan view in FIG. 4, a continuous molded body 130 is formed on the auxiliary carrier 110 or the layer 112 thereof. For this purpose, a transfer molding process may be carried out in which a molding compound (mold compound) is applied on the auxiliary carrier 110. A suitable tool (not shown) is used in this process. The molding compound may be cured after being applied.

The molded body 130 has recesses or cavities 131 via which the connection pads 121, 122 are exposed at a front side. Each recess 131 is respectively assigned to a pair comprising a first and a second connection pad 121, 122 such that the latter are exposed. For this purpose, the recesses 131 are formed in accordance with the grid of the connection pads 121, 122. At the edge of the recesses 131, the connection pads 121, 122 may be partly covered by the molded body 130 on the front side as becomes clear with reference to FIG. 3.

Within each recess 131, a respective web 132 of the molded body 130 is present between the connection pads 121, 122, the web having a smaller thickness than a part of the molded body 130 surrounding the recesses 131. The webs 132 may have the same thickness as the connection pads 121, 122. The recesses 131 may comprise obliquely running side walls and, in plan view, a rectangular contour having rounded corners (cf. FIG. 4).

The molding compound used to form the molded body 130 may comprise a matrix material, for example, epoxy resin or silicone and a particle filling contained in the matrix material, for example, $SiO_2$ particles.

Forming the molded body 130 may potentially have the consequence that within the recesses 131 the connection pads 121, 122 have undesired residues of the molding compound on the front side (not illustrated). After forming the molded body 130, consideration may therefore be given to carrying out a process of removing such residues (deflashing).

To avoid this, a film-assisted transfer molding process may be carried out to form the molded body 130. In this case, the mold cores of a tool part of the tool used are sheathed with a film, for example, composed of ETFE (ethylene-tetrafluoroethylene), for better sealing. What may be achieved in this way is that the connection pads 121, 122 are not afflicted with undesired residues of the molding compound on the front side after the transfer molding process.

Figure 5:
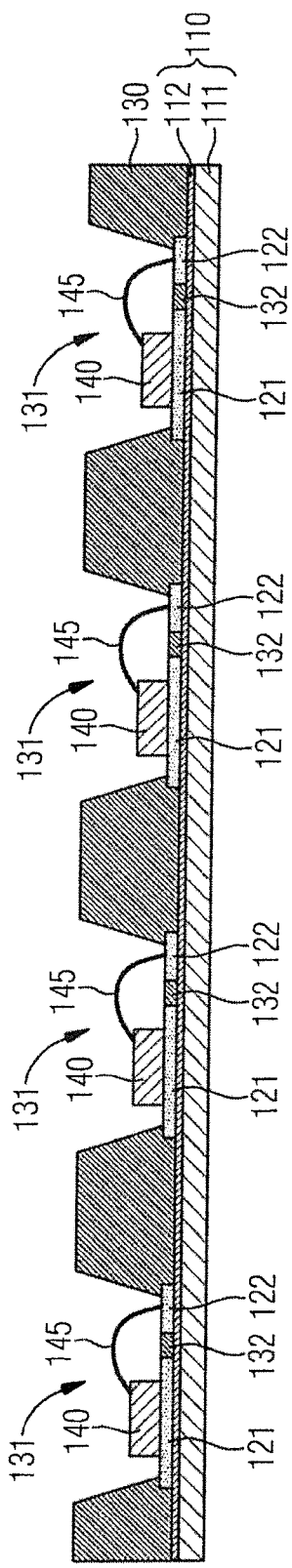
Figure 6:
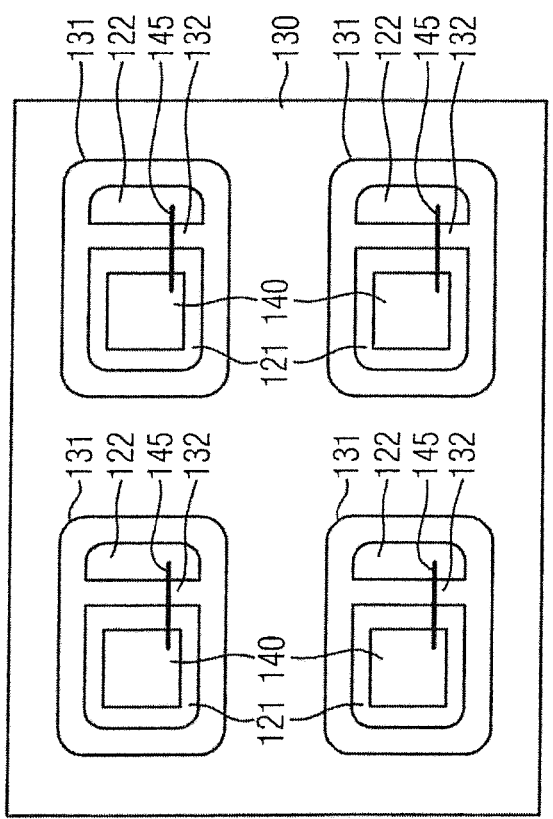

Afterward, as shown from the side in FIG. 5 and in plan view in FIG. 6, optoelectronic semiconductor chips 140 are arranged on the first connection pads 121 within the recesses 131 and electrically connect to the second connection pads 122 via bond wires 145. The semiconductor chips 140, designed to generate a light radiation, may be light-emitting diode chips, for example. The semiconductor chips 140 may be produced in a suitable manner and comprise component parts (not shown) such as a semiconductor layer sequence having an active zone that generates radiation, contacts for contacting the semiconductor chips 140 and the like.

In the configuration indicated in the figures, the semiconductor chips 140 each comprise a front-side contact and a rear-side contact. Via the rear-side contacts and connecting layers (not shown), for example, solder layers or electrically conductive adhesive layers, the semiconductor chips 140 electrically and mechanically connect to the first connection pads 121. The front-side contacts of the semiconductor chips 140 connect to the second connection pads 122 via the bond wires 145.

Figure 7:
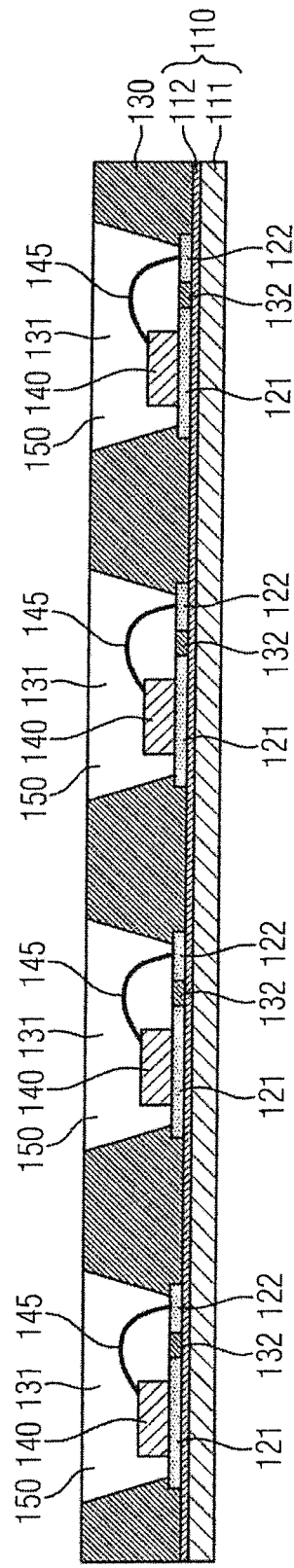

After arranging and contacting the semiconductor chips 140, as shown from the side in FIG. 7, a potting compound 150 is introduced into the recesses 131 of the molded body 130. Each recess 131 may be completely filled with the potting compound 150. The potting compound 150 surrounds the semiconductor chips 140 and the bond wires 145, and forms a protective encapsulation in this way. The potting compound 150 comprises a radiation-transmissive potting material such as silicone, for example. Filling the recesses 131 with the potting compound 150 may be carried out by potting.

In the process of filling the recesses 131, the auxiliary carrier 110 may bring about sealing on the rear side. Despite gaps possibly present between the molded body 130 and the connection pads 121, 122 (not illustrated), contamination of rear sides of the connection pads 121, 122 with the potting compound 150 may therefore be avoided.

The potting compound 150 may be used not only for encapsulation, but also for radiation conversion. In this configuration, the potting compound 150 may comprise, in addition to the potting material, phosphor particles for radiation conversion embedded in the potting material (not illustrated). In this way, the potting compound 150 may convert at least part of a light radiation generated by the semiconductor chips 140 during operation (volume conversion).

Alternatively, the optoelectronic semiconductor chips 140 may comprise conversion layers (not shown) for radiation conversion on a front side (surface conversion). Such conversion layers may be applied on the semiconductor chips 140, for example, after arranging the semiconductor chips 140 on the first connection pads 121 or after wire bonding and before introducing the potting compound 150 into the recesses 131. In this configuration, the potting compound 150 may comprise only the radiation-transmissive potting material.

Figure 8:
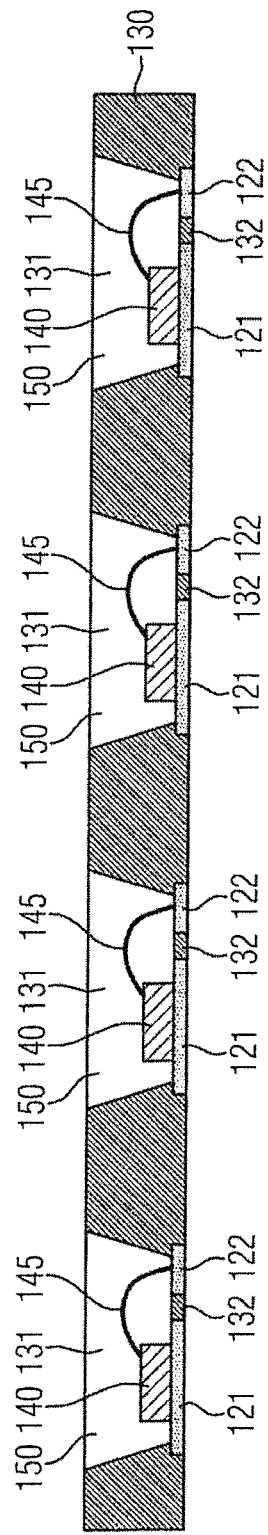

Afterward, or after curing of the potting compound 150, as is shown from the side in FIG. 8, the temporary auxiliary carrier 110 is removed. In this way, a continuous component assemblage is present, which may subsequently be singulated. To remove the auxiliary carrier 110, for example, etching of the layer 112 may be carried out. In this way, the other layer 111 may also be removed.

A further possible process of removing the auxiliary carrier 110 is a laser lift-off process carried out by a laser. Such a process can be carried out in a layer 111 composed of glass. The layer 112 may be decomposed by the laser that may transmit radiation through the glass layer 111.

After removing the auxiliary carrier 110, as shown from the side in FIG. 9 and in plan view in FIG. 10, the component assemblage is singulated into separate optoelectronic components 100. The configuration with the separate connection pads 121, 122 makes it possible to sever only the molded body 130 for this purpose. Simple and fast singulation is possible as a consequence. Severing may be carried out along separating lines 195, oriented perpendicularly to one another in plan view, in regions of the molded body 130 between the recesses 131 (cf. FIG. 10). As a result, the components 100 may have a parallelepipedal shape, and a rectangular contour in plan view.

By way of example, a sawing process may be employed for the severing. The sawing may be carried out at a high sawing speed, for example, of up to 500 mm/s. Alternatively, other processes, for example, laser cutting or water jet cutting are possible.

The singulated optoelectronic components 100 are present in the form of single-chip components. The components 100 each comprise a housing body 135 produced from the molded body 130 with a recess 131, two separate connection pads 121, 122 exposed at a rear side, and an optoelectronic semiconductor chip 140. The semiconductor chip 140 is arranged in the recess 131 of the housing body 135 on a first connection pad 121, connects to a second connection pad 122 via a bond wire 145, and is surrounded by the potting compound 150 introduced into the recess 131. In the components 100, the potting compound 150 forms a respective part of a front side. By the connection pads 121, 122 exposed at the rear side, the components 100 may be arranged on a circuit board (not shown) by soldering or reflow soldering.

Each component 100 comprises a circumferential lateral surface 137 present between the front and rear side and formed exclusively by the housing body 135. In the case of the components 100, the lateral surface 137 is composed of four side walls adjoining one another at right angles. The components 100 comprise no copper webs extending to the lateral surface 137. Therefore, the components 100 are corrosion-stable and insensitive in relation to short circuits.

FIGS. 11 to 20 show a further possible method of producing optoelectronic components 101. The latter are likewise surface-mountable single-chip components in the form of a QFN package. The method in FIGS. 11 to 20 substantially corresponds to the method in FIGS. 1 to 10. Corresponding features, processes and possible advantages and also identical and identically acting component parts are therefore not described in detail again below. For details in respect thereof, reference is instead made to the above description.

In the method in FIGS. 11 to 20, an assemblage of continuous components is likewise fabricated and subsequently singulated into the components 101. FIGS. 11 to 20 illustrate the method on the basis of lateral illustrations and plan view illustrations. Here, too, an excerpt from the assemblage or the conditions respectively present is shown in each case.

Figure 11:
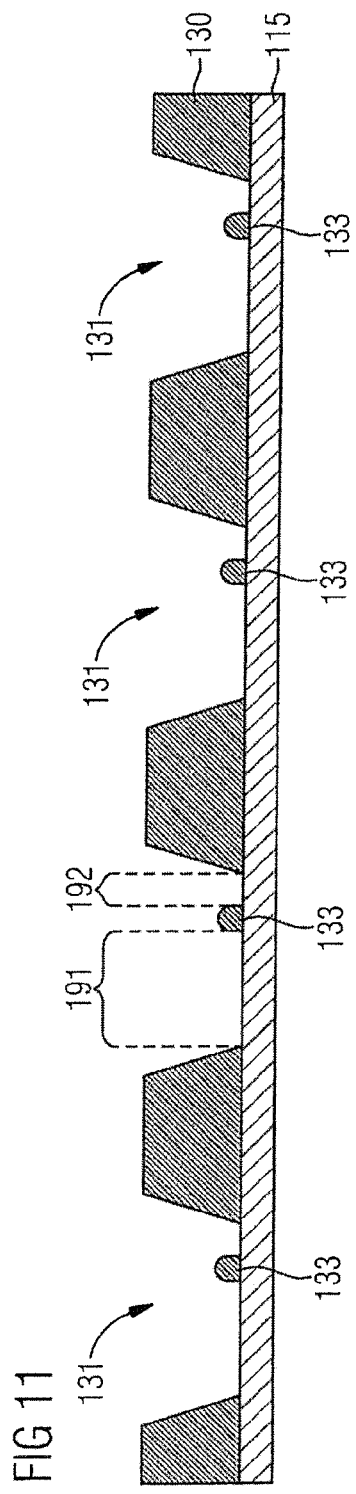
FIGS. 11 to 20 show a further possible method sequence of producing optoelectronic components on the basis of lateral illustrations and plan view illustrations, in which forming connection elements is carrier out after producing a molded body.

A temporarily used auxiliary carrier 115 is provided in the method, the auxiliary carrier being shown from the side in FIG. 11. In contrast to the auxiliary carrier 110, the auxiliary carrier 115 is a monolayer. The auxiliary carrier 115 is electrically conductive or metallic, and composed of copper, for example. Further component parts are subsequently formed on the auxiliary carrier 115.

Figure 12:
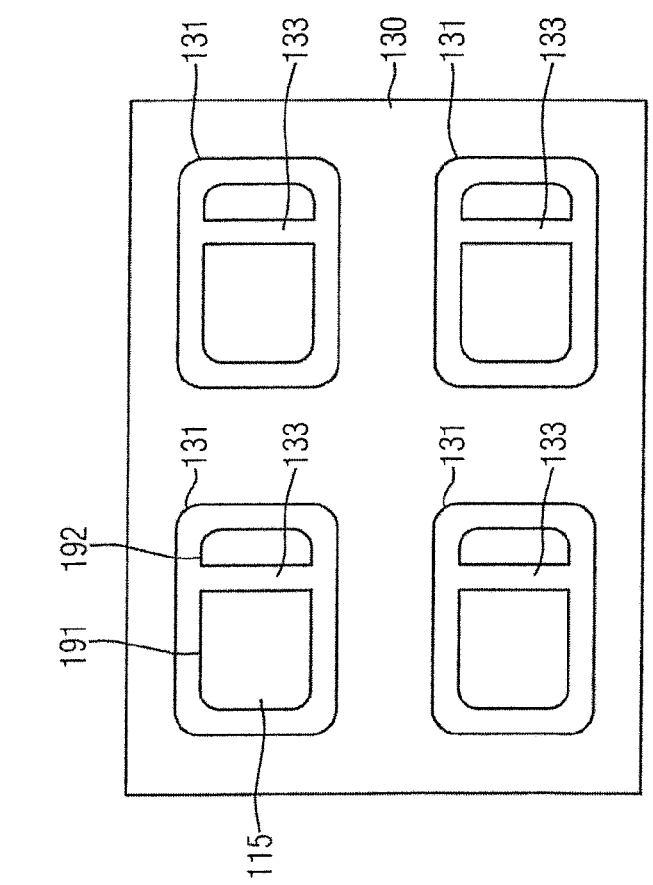

First, as shown from the side in FIG. 11 and in plan view in FIG. 12, a molded body 130 with recesses 131 is formed on a main side of the auxiliary carrier 115. The molded body 130 has a structure such that a part of the main side of the auxiliary carrier 115 is covered and the auxiliary carrier 115 is open or exposed in separate regions 191, 192 at the bottom of the recesses 131. This configuration is subsequently used for forming connection pads 121, 122.

Two opening regions 191, 192 are each provided in the region of each recess 131. Within each recess 131, a respective web 133 of the molded body 130 is present between the opening regions 191, 192, the web having a smaller thickness than a part of the molded body 130 surrounding the recesses 131. The recesses 131 may comprise obliquely running side walls and, in plan view, a rectangular contour having rounded corners. Furthermore, the recesses 131 and the associated opening regions 191, 192 may be present in the form of a grid composed of rows and columns (cf. FIG. 12).

Forming the molded body 130 may be carried out by a transfer molding process in which a molding compound is applied on the auxiliary carrier 115. The molding compound may subsequently be cured. If appropriate, a process of removing undesired residues of the molding compound on the auxiliary carrier 115 within the recesses 131 (if present) may subsequently be carried out. To avoid this, a film assisted transfer molding process may also be carried out for forming the molded body 130.

Figure 13:
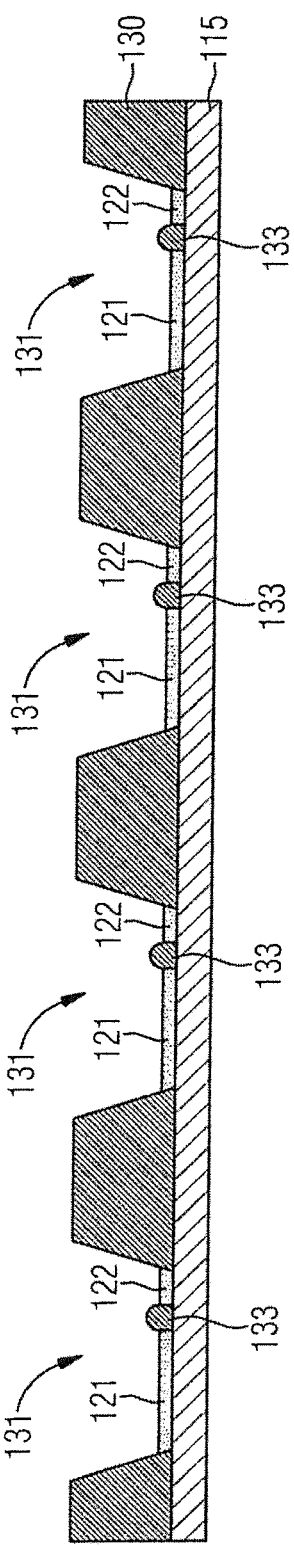
Figure 14:
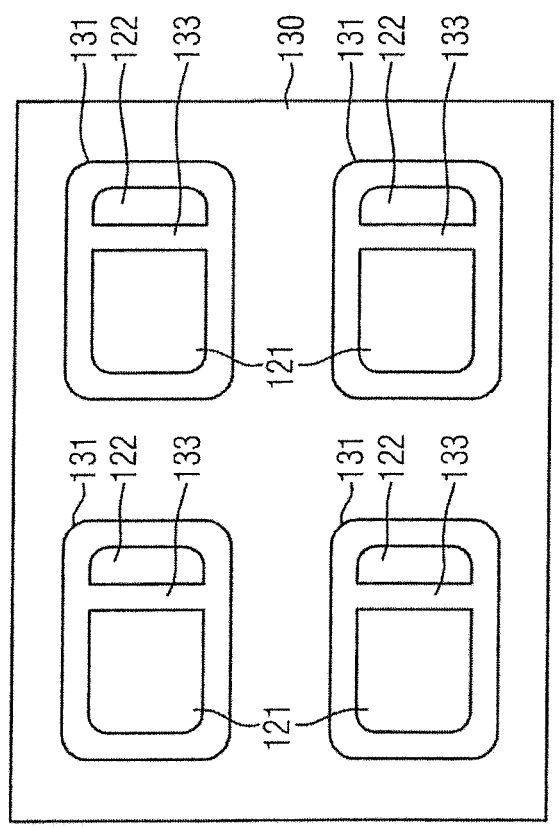

After forming the molded body 130, as shown from the side in FIG. 13 and in plan view in FIG. 14, separate electrically conductive or metallic connection pads 121, 122 are formed on the main side (provided with the molded body 130) of the auxiliary carrier 115 in the opening regions 191, 192. For this purpose, an electrochemical deposition may be carried out in which the electrically conductive auxiliary carrier 115 is used as a deposition electrode. For the deposition, a corresponding electrical potential is applied to the auxiliary carrier 115. In this process, the molded body 130 serves as a masking layer and ensures that targeted coating of the auxiliary carrier 115 in the opening region 191, 192 may be carried out. Use of a different masking layer such as may be used in the method in FIGS. 1 to 10, may thus be obviated. Forming the connection pads 121, 122 may be carried out cost-effectively as a result. Since the electrochemical deposition of the connection pads 121, 122 takes place after forming the molded body 130 in this case, this process may be referred to as post plating.

This applies in the same way to a further possible procedure in which an electroless chemical deposition is carried out to form the connection pads 121, 122 on the main side (provided with the molded body 130) of the electrically conductive auxiliary carrier 115 in the opening regions 191, 192. In this case, too, the molded body 130 serves as a masking layer and ensures that targeted coating of the auxiliary carrier 115 in the opening regions 191, 192 may be carried out. In this way, forming the connection pads 121, 122 may likewise be carried out cost-effectively.

In the method in FIGS. 11 to 20, too, a respective pair comprising a first larger and a second smaller connection pad 121, 122 is formed for each of the components 101 to be produced. The contour of the connection pads 121, 122 depends on the shape of the opening regions 191, 192 exposing the auxiliary carrier 115. As shown in FIG. 14, the connection pads 121, 122 may have in plan view substantially a rectangular shape having partly rounded corners. The connection pads 121, 122 may furthermore be formed such that the connection pads 121, 122 have a smaller thickness than the webs 133 of the molded body 130. As a result, it is possible to avoid a situation in which a pair of two connection pads 121, 122 is formed in a manner connected to one another and is thereby short-circuited.

The connection pads 121, 122 may be formed in monolayer fashion or alternatively in multilayer fashion composed of different partial layers comprising different materials (not illustrated). To realize a multilayer configuration, a plurality of electrochemical deposition processes or a plurality of chemical deposition processes may be carried out successively.

Figure 15:
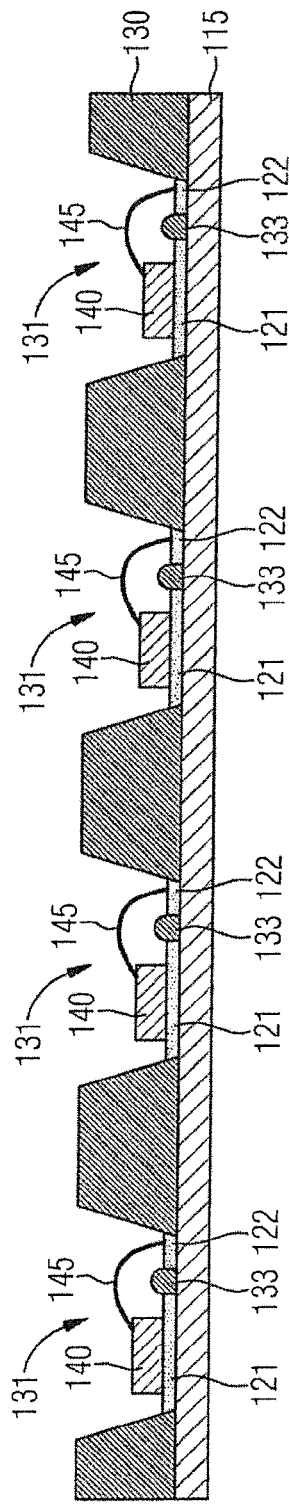
Figure 16:
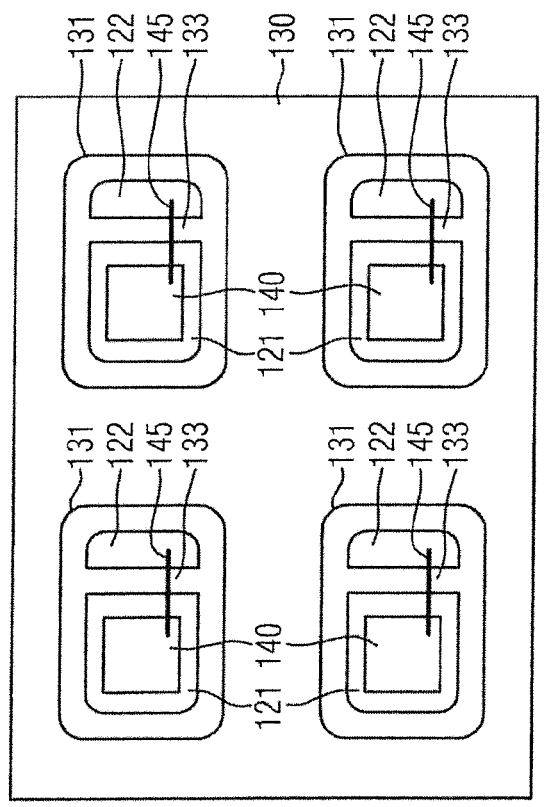

After forming the connection pads 121, 122, as shown from the side in FIG. 15 and in plan view in FIG. 16, optoelectronic semiconductor chips 140 are arranged on the first connection pads 121 within the recesses 131 and connected to the second connection pads 122 via bond wires 145. The semiconductor chips 140 designed to generate a light radiation may be light-emitting diode chips, for example.

Figure 17:
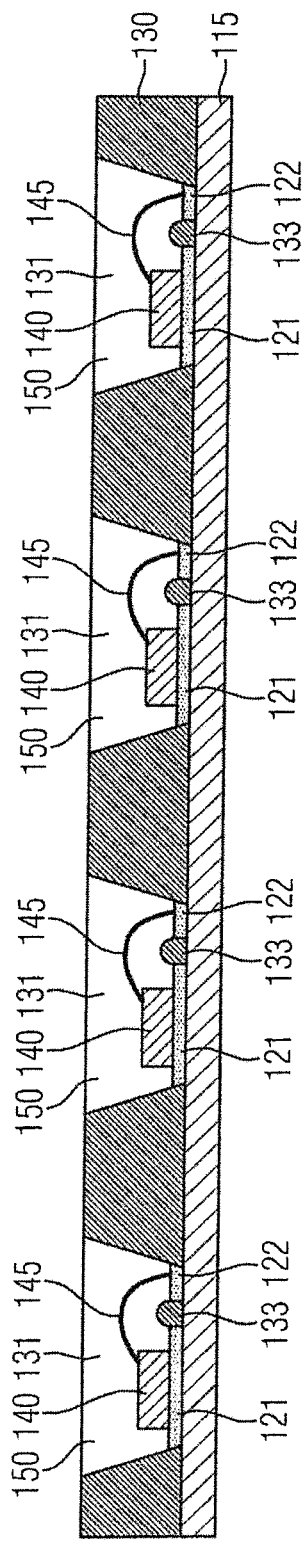

Afterward, as shown from the side in FIG. 17, a potting compound 150 is introduced into the recesses 131 of the molded body 130. Each recess 131 may be completely filled with the potting compound 150. The potting compound 150 surrounds the semiconductor chips 140 and the bond wires 145 and forms a protective encapsulation in this way. The potting compound 150 comprises a radiation-transmissive material. The potting compound 150 may furthermore comprise phosphor particles for radiation or volume conversion embedded in the potting material (not illustrated). Alternatively, conversion layers (not shown) for radiation or surface conversion may be provided on the front sides of the optoelectronic semiconductor chips 140.

Figure 18:
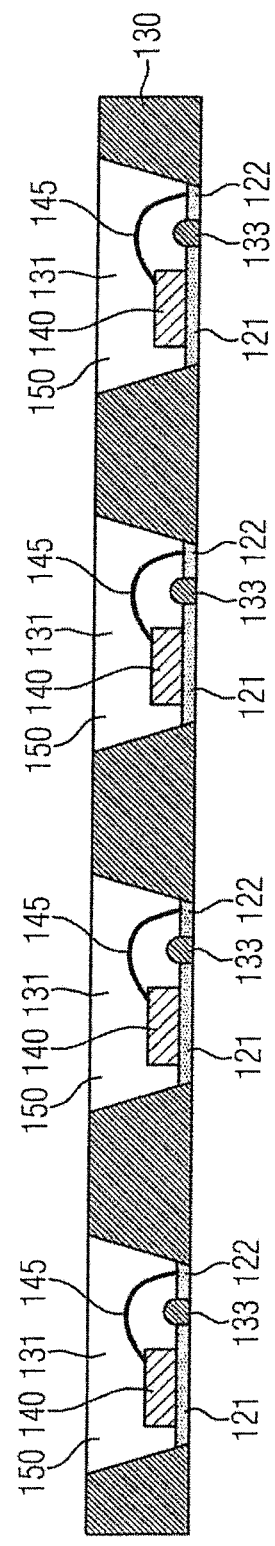

Afterward or after curing the potting compound 150, as shown from the side in FIG. 18, the temporary auxiliary carrier 115 is removed. An etching process may be carried out for this purpose. In this case, at least part of the carrier material of the auxiliary carrier 115, that is to say copper, for example, may be recycled.

Figure 19:
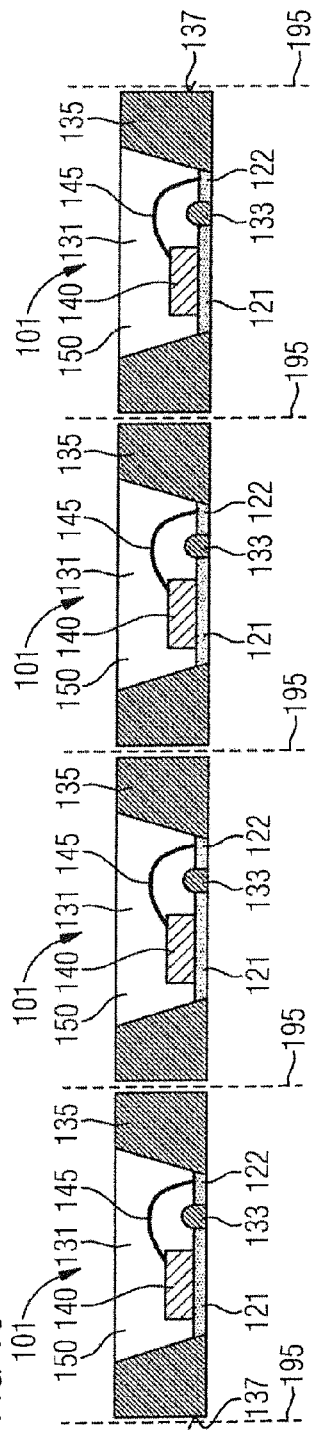
Figure 20:
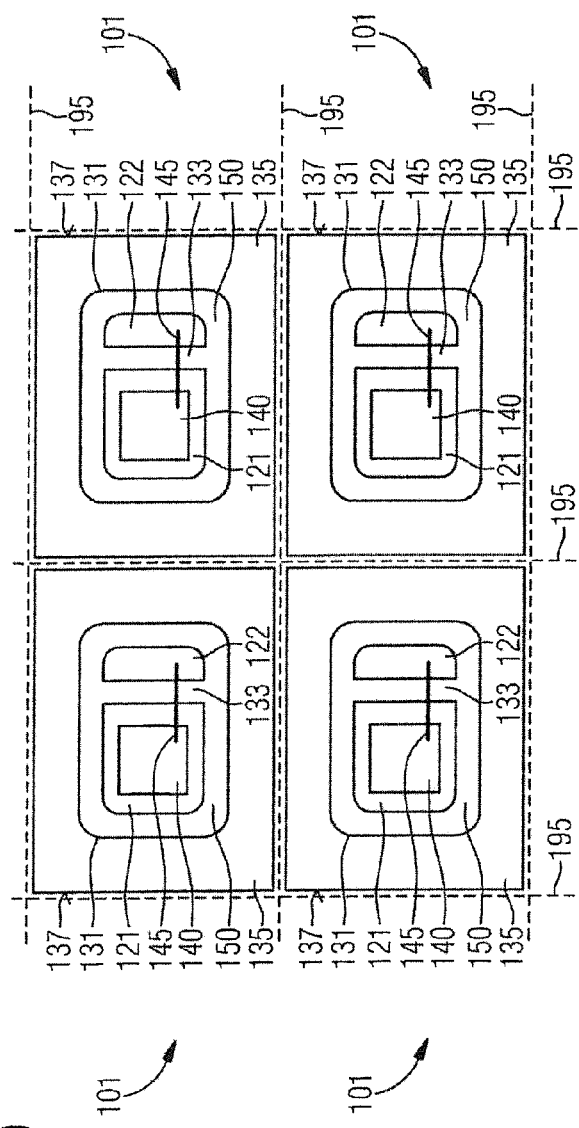

After removing the auxiliary carrier 115, a continuous component assemblage is present, which is subsequently singulated into optoelectronic components 101, as shown from the side in FIG. 19 and in plan view in FIG. 20. In this case, once again, on account of the configuration with the separate connection pads 121, 122, only the molded body 130 may be severed. The severing may be carried out along separating lines 195 (oriented perpendicularly to one another in plan view) in regions of the molded body 130 between the recesses 131 (cf. FIG. 20). In this way, the components 101 may have a rectangular contour or a parallelepipedal shape in plan view. The severing can be carried out by sawing or some other process such as, for example, laser cutting or water jet cutting.

The optoelectronic components 101 are likewise present in the form of surface-mountable single-chip components. The components 101 each comprise a housing body 135 produced from the molded body 130 with a recess 131, two separate connection pads 121, 122 exposed at the rear side, and an optoelectronic semiconductor chip 140. The semiconductor chip 140 is arranged in the recess 131 of the housing body 135 on a first connection pad 121, is connected to a second connection pad 122 via a bond wire 145, and is potted with the potting compound 150.

The components 101 also comprise a circumferential lateral surface 137 composed of four side walls and formed exclusively by the housing body 135. Therefore, the components 101 are corrosion-stable and insensitive in relation to short circuits.

The configuration explained with reference to the figures constitute preferred examples. Besides the examples described and depicted, further examples are possible which may comprise further modifications and/or combinations of features. It is possible, for example, to use other materials instead of the materials indicated above. Moreover, other processes may be carried out instead of processes indicated above. This relates, for example, to applying material of the connection elements 121, 122.

The method shown in FIGS. 1 to 10 may be modified such that the monolayer auxiliary carrier 115 from the method in FIGS. 11 to 20 is used instead of the two-layered auxiliary carrier 110. In the same way, the two-layered auxiliary carrier 110 may be used in the method in FIGS. 11 to 20. In this case, the layer 112 is electrically conductive and composed of ZnO, for example, to enable an electrochemical deposition or an electroless chemical deposition.

Furthermore, component parts and structures, for example, connection elements 121, 122 and recesses 131 of a molded body 130, may be realized with other shapes and geometries. By way of example, round or oval recesses in plan view may be provided instead of rectangular recesses 131.

Further possible modifications concern the usable optoelectronic semiconductor chips 140. By way of example, semiconductor chips 140 comprising two rear-side contacts may be used. In such a configuration, two connection elements 121, 122 may be provided for each of the semiconductor chips 140. As a result, each semiconductor chip 140 may be arranged by the two rear-side contacts on two connection elements 121, 122 and be connected thereto.

Furthermore, semiconductor chips 140 comprising two front-side contacts may also be used. In such a configuration, two connection elements 121, 122 may likewise be provided for each of the semiconductor chips 140. In this case, each semiconductor chip 140 may be arranged on a connection element 121, and one of the two front-side contacts may connect to the same connection element 121 via a bond wire 145. The other front-side contact may connect to a further connection element 122 via a further bond wire 145.

For semiconductor chips 140 comprising two front-side contacts, in each case three connection elements may also be provided. In this way, each semiconductor chip 140 may be arranged on a connection element, and the front-side contacts may connect to two further connection elements via bond wires 145.

A fabrication method may furthermore be modified such that multi-chip components comprising a plurality of optoelectronic semiconductor chips 140 are produced instead of single-chip components. Such components may, for example, each comprise a housing body produced from a molded body 130 with a plurality of separate recesses 131 in which semiconductor chips 140 may be arranged on corresponding connection elements.

In this connection, attention is drawn to the possibility of singulating the component assemblage depicted in FIG. 8 or 18 by a corresponding choice of the separating lines 195 into multi-chip components having a plurality of recesses 131, and not into the components 100, 101 shown. In such multi-chip components, the semiconductor chips 140 arranged in the recesses 131 may be operated separately.

It is also possible to fabricate multi-chip components each comprising a housing body with a common recess, and a plurality of semiconductor chips 140 arranged within the common recess. A plurality of semiconductor chips 140 may be arranged on individual, or else on one or more common connection elements. The fabrication method may be carried out for this purpose such that in each case a plurality of connection elements or opening regions to be coated are present in the region of a recess of the molded body 130. Furthermore, a plurality of semiconductor chips 140 positioned in a common recess of the molded body 130 may electrically interconnect, for example, by bond wires 145.

Although our components and methods have been more specifically illustrated and described in detail by preferred examples, nevertheless this disclosure is not restricted by the examples disclosed and other variations may be derived therefrom by those skilled in the art, without departing from the scope of protection of the appended claims.

This application claims priority of DE 10 2014 102 183.5, the subject matter of which is hereby incorporated by reference.

The invention claimed is:

1. A method of producing optoelectronic components comprising:
providing an auxiliary carrier;
forming separate connection elements on the auxiliary carrier;
forming a molded body on the auxiliary carrier with recesses;
arranging optoelectronic semiconductor chips on connection elements in the recesses of the molded body;
removing the auxiliary carrier; and
severing the molded body to form singulated optoelectronic components,
wherein the molded body is formed on the auxiliary carrier, the molded body covers a part of the auxiliary carrier such that the auxiliary carrier is exposed in separate opening regions, after forming the molded body the separate connection elements are formed, and forming the separate connection elements comprises applying material on the auxiliary carrier in the opening regions.

2. The method according to claim 1, wherein forming the separate connection elements comprises applying material on the auxiliary carrier in separate application regions.

3. The method according to claim 1, wherein forming the separate connection elements comprises carrying out one of electrochemical deposition, sputtering process or chemical deposition.

4. The method according to claim 1, wherein forming the separate connection elements comprises carrying out a printing process.

5. The method according to claim 1, wherein the molded body is a masking layer for forming the separate connection elements in the opening regions.

6. The method according to claim 1, wherein forming the separate connection elements comprises carrying out one of electrochemical deposition or chemical deposition.

7. The method according to claim 1, further comprising introducing a potting compound into the recesses of the molded body.

8. The method according to claim 1, wherein the auxiliary carrier comprises an electrically conductive material.

9. The method according to claim 1, wherein the auxiliary carrier comprises a first layer and a second layer, and the connection elements and the molded body are formed on the second layer.

10. The method according to claim 1, wherein removing the auxiliary carrier is carried out by an etching process.

11. The method according to claim 1, wherein removing the auxiliary carrier is carried out by a laser lift-off process.

12. The method according to claim 11, wherein the auxiliary carrier comprises a first layer composed of glass and a second layer composed of a different material, the connection elements and the molded body are formed on the second layer, and in the laser lift-off process radiation of a laser is transmitted through the first layer to decompose the second layer.

13. An optoelectronic component produced by carrying out the method according to claim 1, wherein the component comprises a housing body produced by severing of the molded body, and the component comprises a circumferential lateral surface formed exclusively by the housing body.

* * * * *